US007515208B1

(12) United States Patent
Young et al.

(10) Patent No.: US 7,515,208 B1
(45) Date of Patent: Apr. 7, 2009

(54) APPARATUS, SYSTEM, AND METHOD FOR DETECTING AC-COUPLED ELECTRICAL LOADS

(75) Inventors: Wayne Douglas Young, Milpitas, CA (US); Brijesh Tripathi, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 876 days.

(21) Appl. No.: 10/962,358

(22) Filed: Oct. 8, 2004

(51) Int. Cl.
*H03M 1/12* (2006.01)

(52) U.S. Cl. ....................... 348/572; 348/180; 348/571; 348/554

(58) Field of Classification Search ................. 348/180, 348/192, 553–555, 558, 571–572, 725; 341/141, 341/144; *H03M 1/12*
See application file for complete search history.

(56) References Cited

U.S. PATENT DOCUMENTS

| | | | | |
|---|---|---|---|---|
| 5,452,725 | A | 9/1995 | Martenson | |
| 5,825,321 | A | 10/1998 | Park | |
| 5,986,719 | A | 11/1999 | Nakamura | |
| 6,278,390 | B1 | 8/2001 | Meyer et al. | |
| 6,411,330 | B1 * | 6/2002 | Purcell et al. | 348/180 |
| 6,522,278 | B1 | 2/2003 | Rhode et al. | |
| 6,545,707 | B1 * | 4/2003 | Newcomb et al. | 348/192 |
| 6,657,424 | B1 | 12/2003 | Voisine et al. | |
| 6,759,868 | B2 | 7/2004 | Helt et al. | |
| 6,940,440 | B1 * | 9/2005 | Iacob | 341/144 |
| 6,989,779 | B2 * | 1/2006 | Sasaki et al. | 341/144 |
| 7,079,058 | B2 * | 7/2006 | Efland et al. | 341/110 |

* cited by examiner

*Primary Examiner*—Trang U Tran
(74) *Attorney, Agent, or Firm*—Cooley Godward Kronish LLP

(57) ABSTRACT

Apparatus, system, and method for detecting AC-coupled electrical loads of a set of digital-to-analog converters are described. In one embodiment, a processing apparatus includes a digital-to-analog converter. The processing apparatus also includes a pulse generation module connected to the digital-to-analog converter, and the pulse generation module is configured to direct the digital-to-analog converter to transmit a pulse of electrical energy. The processing apparatus further includes a load detection module connected to the digital-to-analog converter, and the load detection module is configured to determine a connection status of the digital-to-analog converter based on a degree to which the pulse of electrical energy is reflected during a transient response time period.

7 Claims, 4 Drawing Sheets

APPARATUS, SYSTEM, AND METHOD FOR DETECTING AC-COUPLED ELECTRICAL LOADS

BRIEF DESCRIPTION OF THE INVENTION

The invention relates generally to detecting electrical loads. More particularly, the invention relates to an apparatus, system, and method for detecting alternating current ("AC")-coupled electrical loads of a set of digital-to-analog converters.

BACKGROUND OF THE INVENTION

Advanced television systems sometimes include a load detection mechanism to detect an external electrical load of a digital-to-analog converter. The digital-to-analog converter can be included in, for example, a graphics card of a computer and can operate to supply a video signal to be displayed by a television set. Detection of the external electrical load indicates that the digital-to-analog converter is connected to the television set. During operation of an existing load detection mechanism, a predetermined electric current is supplied at an output end of the digital-to-analog converter, and a voltage at the output end of the digital-to-analog converter is detected. As can be appreciated, the voltage at the output end of the digital-to-analog converter depends on an effective electrical load of the digital-to-analog converter, which, in turn, depends on whether the external electrical load is connected to the output end of the digital-to-analog converter. If a certain threshold voltage is exceeded, the external electrical load is deemed to be disconnected. On the other hand, if the threshold voltage is not exceeded, the external electrical load is deemed to be connected to the output end of the digital-to-analog converter.

An existing load detection mechanism can operate in a satisfactory manner for certain types of television sets having direct current ("DC")-coupling at their inputs. However, television set manufacturers have expressed interest in using AC-coupling at inputs of television sets, such as by including coupling capacitors that are connected to input ports of the television sets. Such AC-coupling can defeat operation of an existing load detection mechanism. In particular, since a coupling capacitor can behave as an "open-circuit" under certain conditions, an external electrical load may be deemed to be disconnected even if the external electrical load is actually connected to an output end of a digital-to-analog converter.

It is against this background that a need arose to develop the apparatus, system, and method described herein.

SUMMARY OF THE INVENTION

In one innovative aspect, the invention relates to a processing apparatus. In one embodiment, the processing apparatus includes a digital-to-analog converter. The processing apparatus also includes a pulse generation module connected to the digital-to-analog converter, and the pulse generation module is configured to direct the digital-to-analog converter to transmit a pulse of electrical energy. The processing apparatus further includes a load detection module connected to the digital-to-analog converter, and the load detection module is configured to determine a connection status of the digital-to-analog converter based on a degree to which the pulse of electrical energy is reflected during a transient response time period.

In another innovative aspect, the invention relates to a processing apparatus to direct operation of a set of digital-to-analog converters. In one embodiment, the processing apparatus includes a load detection module connected to the set of digital-to-analog converters, and the load detection module is configured to detect an output voltage of a first digital-to-analog converter of the set of digital-to-analog converters to determine whether the first digital-to-analog converter is connected to an output device via a first coupling capacitor. The output voltage of the first digital-to-analog converter is detected subsequent to a start of transmission of a first pulse of electrical energy by the first digital-to-analog converter and prior to the first coupling capacitor being substantially charged up by the first pulse of electrical energy. The processing apparatus also includes a control module connected to the set of digital-to-analog converters and to the load detection module, and the control module is configured to direct the first digital-to-analog converter to transmit at least one of an audio signal and a video signal to the output device if the first digital-to-analog converter is connected to the output device.

In yet another innovative aspect, the invention relates to a method of transmitting signals via a set of output ports. In one embodiment, the method includes transmitting a set of pulses of electrical energy via respective ones of the set of output ports. The method also includes determining that at least one of the set of output ports is connected to an output device based on a degree of reflection of the set of pulses of electrical energy. The method further includes transmitting at least one of an audio signal and a video signal to the output device via the at least one of the set of output ports.

In a further innovative aspect, the invention relates to a processing apparatus to select signals to be transmitted to an external device via a set of output ports. In one embodiment, the processing apparatus includes a pulse generation module connected to the set of output ports, and the pulse generation module is configured to transmit a set of pulses of electrical energy via respective ones of the set of output ports. The processing apparatus also includes a load detection module connected to the set of output ports, and the load detection module is configured to determine a connection status of the set of output ports with respect to the external device based on a degree of reflection of the set of pulses of electrical energy. The processing apparatus further includes a control module connected to the load detection module, and the control module is configured to select a format of a signal to be transmitted to the external device based on the connection status.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings, in which.

DETAILED DESCRIPTION

Figure 1:
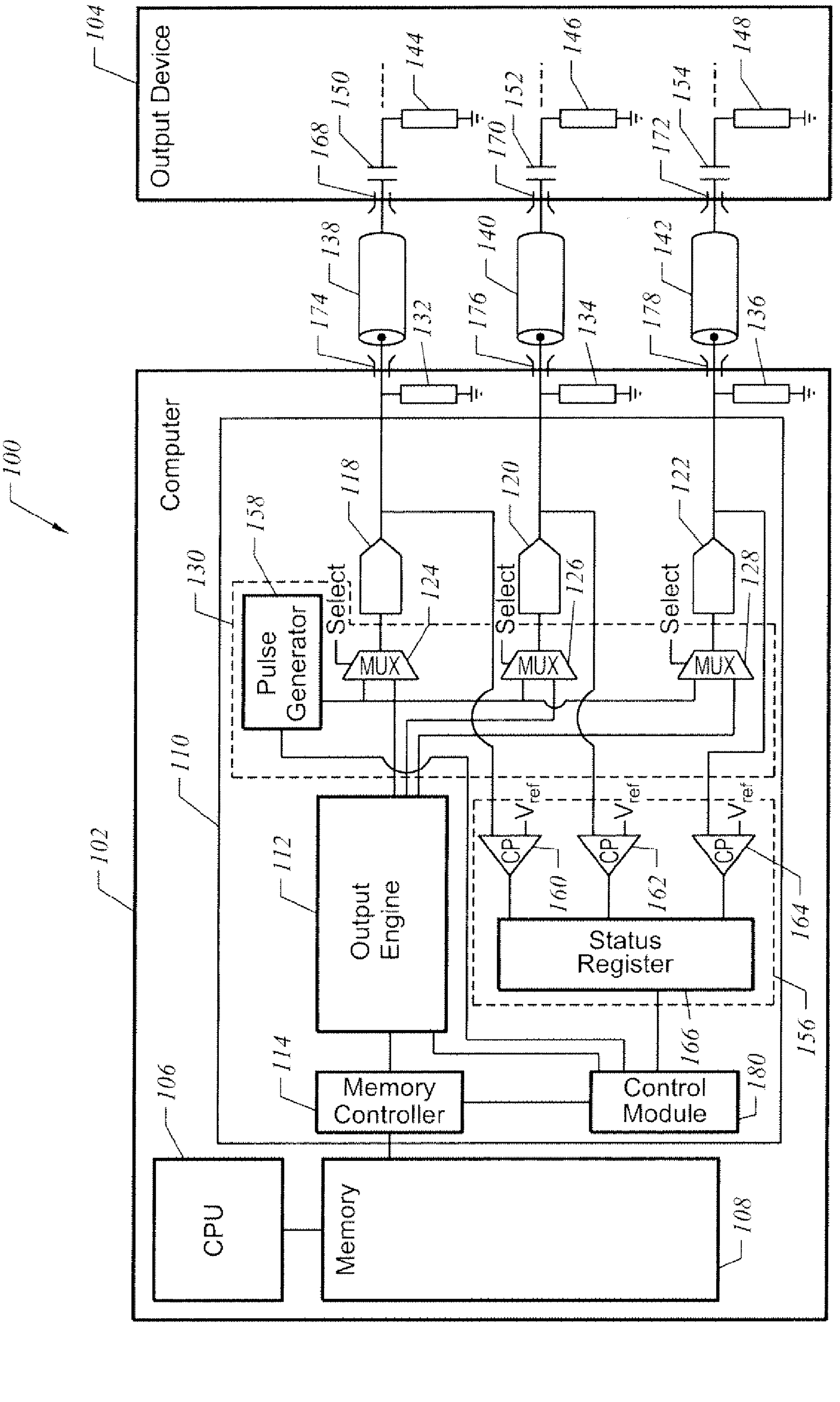
FIG. 1 illustrates a computer system that can be operated in accordance with an embodiment of the invention.

FIG. 1 illustrates a computer system 100 that can be operated in accordance with an embodiment of the invention. The computer system 100 includes a computer 102, which can be, for example, a desktop computer, a server computer, a laptop computer, a palm-sized computer, a tablet computer, a game console, a portable wireless terminal such as a personal digital assistant or a cellular telephone, a computer-based simulator, or any other device with signal processing capability. The computer system 100 also includes an external device, namely an output device 104, which can be, for example, an audio device such as a speaker or a display device such as a television set or a computer monitor.

In the illustrated embodiment, the computer 102 is connected to the output device 104 via a set of cables 138, 140, and 142. The cables 138, 140, and 142 can be any conventional cables, such as conventional coaxial cables. As illustrated in FIG. 1, the computer 102 includes a set of output ports 174, 176, and 178, and the output device 104 includes a corresponding set of input ports 168, 170, and 172, which are connected to respective ones of the output ports 174, 176, and 178 via the cables 138, 140, and 142. While the output device 104 as illustrated in FIG. 1 includes three input ports, it is contemplated that more or less input ports can be included depending on the particular implementation. In particular, the number of input ports included in the output device 104 typically depends on its presentation capabilities. For example, the output device 104 can be a television set, and, depending on the particular format of a television signal that can be displayed, the television set can include a single input port, two input ports, or three input ports. As illustrated in FIG. 1, the output device 104 also includes a set of external electrical loads, namely a resistor 144, a resistor 146, and a resistor 148, which are connected to respective ones of the input ports 168, 170, and 172. In the illustrated embodiment, the resistors 144, 146, and 148 are AC-coupled to the input ports 168, 170, and 172 via respective ones of a set of coupling capacitors 150, 152, and 154. It is also contemplated that one or more of the resistors 144, 146, and 148 can be DC-coupled.

As illustrated in FIG. 1, the computer 102 includes a central processing unit ("CPU") 106, which is connected to a memory 108. The memory 108 can include, for example, a random access memory ("RAM"), a read only memory ("ROM"), or both. In the illustrated embodiment, the computer 102 also includes a processing apparatus 110 that is connected to the memory 108. The processing apparatus 110 can be a graphics processing apparatus, such as a graphics processing unit ("GPU"). As further discussed below, the processing apparatus 110 determines its connection status with respect to the output device 104 and transmits either of, or both, an audio signal and a video signal to the output device 104 based on its connection status.

In the illustrated embodiment, the processing apparatus 110 includes a set of digital-to-analog converters 118, 120, and 122. While three digital-to-analog converters are illustrated in FIG. 1, it is contemplated that more or less digital-to-analog converters can be included depending on the particular implementation. Each of the digital-to-analog converters 118, 120, and 122 operates to convert a digital signal into a corresponding analog signal. In particular, each of the digital-to-analog converters 118, 120, and 122 receives a digital signal via its input end and transmits a corresponding analog signal via its output end. As illustrated in FIG. 1, the input ends of the digital-to-analog converters 118, 120, and 122 are connected to respective ones of a set of multiplexers, namely a multiplexer ("MUX") 124, a MUX 126, and a MUX 128. The MUX 124, the MUX 126, and the MUX 128 form a portion of a pulse generation module 130, which is further discussed below. The output ends of the digital-to-analog converters 118, 120, and 122 are connected to respective ones of a set of internal electrical loads, namely a resistor 132, a resistor 134, and a resistor 136, which are connected to respective ones of the output ports 174, 176, and 178. As illustrated in FIG. 1, the output ends of the digital-to-analog converters 118, 120, and 122 are also connected to respective ones of a set of comparators, namely a comparator ("CP") 160, a CP 162, and a CP 164. The CP 160, the CP 162, and the CP 164 form a portion of a load detection module 156, which is further discussed below.

As illustrated in FIG. 1, the processing apparatus 110 also includes the pulse generation module 130 and the load detection module 156, which are connected to the digital-to-analog converters 118, 120, and 122. The pulse generation module 130 and the load detection module 156 operate in combination to determine a connection status of each of the digital-to-analog converters 118, 120, and 122 with respect to the output device 104. In particular, the pulse generation module 130 and the load detection module 156 operate in combination to determine whether the digital-to-analog converters 118, 120, and 122 are connected to respective ones of the resistors 144, 146, and 148 that are included in the output device 104.

The pulse generation module 130 directs each of the digital-to-analog converters 118, 120, and 122 to transmit a pulse of electrical energy. As illustrated in FIG. 1, the pulse generation module 130 includes a pulse generator 158 and the MUX 124, the MUX 126, and the MUX 128, which are connected to the pulse generator 158 and to respective ones of the digital-to-analog converters 118, 120, and 122. During operation, the pulse generator 158 generates a digital signal, and, in response to appropriate select control signals being applied, the MUX 124, the MUX 126, and the MUX 128 transmit this digital signal to the input ends of the digital-to-analog converters 118, 120, and 122. In response to receiving this digital signal, each of the digital-to-analog converters 118, 120, and 122 transmits, via its output end, a pulse of electrical energy.

The load detection module 156 determines a connection status of each of the digital-to-analog converters 118, 120, and 122 based on a degree to which a pulse of electrical energy that is transmitted is reflected. Typically, impedances of the resistors 132, 134, and 136, impedances of the cables 138, 140, and 142, and impedances of the resistors 144, 146, and 148 are matched to improve the quality of signal transmission to the output device 104 by reducing reflections or echoes. For certain implementations, these impedances can be matched to have substantially the same value, such as 75Ω. In the illustrated embodiment, the load detection module 156 operates to exploit such impedance matching to determine a connection status of each of the digital-to-analog converters 118, 120, and 122. In particular, as a result of such impedance matching, the load detection module 156 determines that a particular one of the digital-to-analog converters 118, 120, and 122 is connected to the output device 104 if a pulse of electrical energy that is transmitted by that digital-to-analog converter is reflected to a relatively small degree, such as below a certain reference level. On the other hand, disconnecting a particular one of the digital-to-analog converters 118, 120, and 122 from the output device 104 effectively causes an impedance mismatch. As a result of such impedance mismatch, the load detection module 156 determines that a particular one of the digital-to-analog converters 118, 120, and 122 is disconnected from the output device 104 if a pulse of electrical energy that is transmitted by that digital-to-analog converter is reflected to a relatively large degree, such as above a certain reference level. In the illustrated embodiment, the load detection module 156 determines a degree to which a pulse of electrical energy is reflected during a transient response time period. Advantageously, the transient response time period can be an initial time period during which the coupling capacitors 150, 152, and 154 substantially behave as "short-circuits". In such manner, the load detection module 156 can accurately determine a connection status of each of the digital-to-analog converters 118, 120, and 122 despite the presence of the coupling capacitors 150, 152, and 154. Moreover, the load detection module 156 is backward compatible with output devices having DC-coupling at their inputs. In particular, by operating in a similar manner as discussed above, the load detection module 156 can also accurately determine a connection status of each of the digital-to-analog converters 118, 120, and 122 in the event that one or more of the coupling capacitors 150, 152, and 154 are omitted.

As illustrated in FIG. 1, once a particular one of the digital-to-analog converters 118, 120, and 122 transmits a pulse of electrical energy, the load detection module 156 determines a degree to which the pulse of electrical energy is reflected based on a voltage at the output end of that digital-to-analog converter. To determine the degree to which the pulse of electrical energy is reflected during the transient response time period, the load detection module 156 detects the output voltage of that digital-to-analog converter at a measurement time during the transient response time period. As can be appreciated with reference to FIG. 1, the degree to which the pulse of electrical energy is reflected affects the amount of electric current that passes through a particular one of the resistors 132, 134, and 136 that is connected to that digital-to-analog converter, which, in turn, affects the output voltage of that digital-to-analog converter. As illustrated in FIG. 1, the load detection module 156 includes the CP 160, the CP 162, and the CP 164, which are connected to respective ones of the digital-to-analog converters 118, 120, and 122. The load detection module 156 also includes a status register 166, which is connected to the CP 160, the CP 162, and the CP 164. During operation, each of the CP 160, the CP 162, and the CP 164 receives an output voltage of a respective one of the digital-to-analog converters 118, 120, and 122 at a measurement time and compares the output voltage with a reference voltage. Based on such comparison, each of the CP 160, the CP 162, and the CP 164 generates an indication of a connection status of a respective one of the digital-to-analog converters 118, 120, and 122, which indication is transmitted to and stored in the status register 166.

In the illustrated embodiment, the processing, apparatus 110 also includes a control module 180, which is connected to and directs operation of the digital-to-analog converters 118, 120, and 122, the pulse generation module 130, and the load detection module 156. The control module 180 is also connected to and also directs operation of an output engine 112 and a memory controller 114, which are further discussed below. As illustrated in FIG. 1, the control module 180 is connected to the status register 166. By accessing indications that are stored in the status register 166, the control module 180 determines which ones of the digital-to-analog converters 118, 120, and 122 (if any) are connected to the output device 104. In such manner, either of, or both, an audio signal and a video signal can be transmitted to the output device 104 via the particular ones of the digital-to-analog converters 118, 120, and 122 that are connected to the output device 104. Also, by accessing the indications that are stored in the status register 166, the control module 180 determines how many of the digital-to-analog converters 118, 120, and 122 are connected to the output device 104. If the computer 102 is properly connected to the output device 104 as illustrated in FIG. 1, the number of digital-to-analog converters that are connected to the output device 104 typically corresponds to the number of input ports included in the output device 104, which, in turn, typically depends on the presentation capabilities of the output device 104. In such manner, the control module 180 can determine the presentation capabilities of the output device 104, and, based on the presentation capabilities, the control module 180 can select a format of either of, or both, an audio signal and a video signal that is transmitted to the output device 104. Advantageously, the control module 180 can determine the presentation capabilities of the output device 104 without requiring a dedicated communications interface to be provided, such as an Extended Display Identification Data ("EDID") interface.

With reference to FIG. 1, the processing apparatus 110 also includes the output engine 112, which can be, for example, a graphics processing pipeline. The output engine 112 is connected to the memory 108 via the memory controller 114, which serves as an interface between the output engine 112 and the memory 108. The output engine 112 is also connected to the digital-to-analog converters 118, 120, and 122 via respective ones of the MUX 124, the MUX 126, and the MUX 128. During operation, the memory controller 114 retrieves data from the memory 108 and delivers the data to the output engine 112. In turn, the output engine 112 processes the data to generate a digital signal, which corresponds to either of, or both, an audio signal and a video signal having a selected format. In response to appropriate select control signals being applied, particular ones of the MUX 124, the MUX 126, and the MUX 128 transmit this digital signal to the input ends of the particular ones of the digital-to-analog converters 118, 120, and 122 that are connected to the output device 104. In turn, the particular ones of the digital-to-analog converters 118, 120, and 122 transmit, via their output ends, a corresponding analog signal to the output device 104, which, in turn, processes this analog signal to generate either of, or both, an audio output and a visual output.

The foregoing provides a general overview of an embodiment of the invention. Attention next turns to FIG. 2, which illustrates a flowchart for transmitting signals via a set of output ports (e.g., the output ports 174, 176, and 178) in accordance with an embodiment of the invention.

Figure 2:
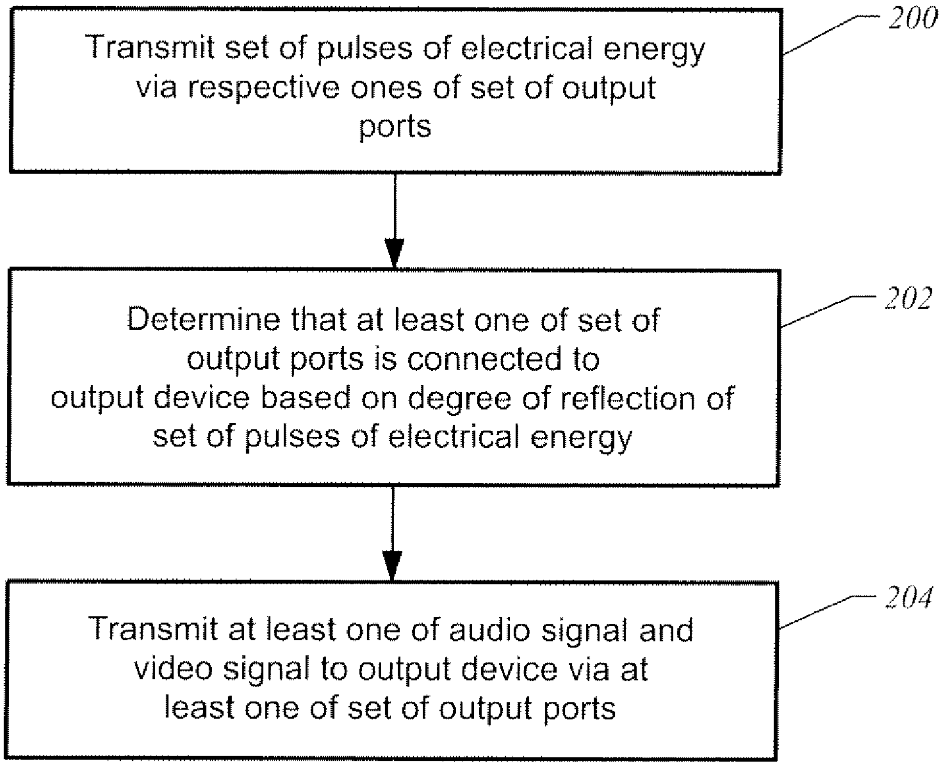
FIG. 2 illustrates a flowchart for transmitting signals via a set of output ports in accordance with an embodiment of the invention.

The first operation illustrated in FIG. 2 is to transmit a set of pulses of electrical energy via respective ones of the set of output ports (block 200). In general, the set of pulses of electrical energy can be transmitted at the same time or at different times. In the illustrated embodiment, the set of output ports are connected to respective ones of a set of digital-to-analog converters (e.g., the digital-to-analog converters 118, 120, and 122). A pulse generation module (e.g., the pulse generation module 130) is connected to the set of digital-to-analog converters, and the pulse generation module directs each of the set of digital-to-analog converters to transmit a pulse of electrical energy, which can be, for example, a pulse of electric current. In particular, the pulse generation module directs a first digital-to-analog converter (e.g., the digital-to-analog converter 118) to transmit a first pulse of electrical energy via a first output port (e.g., the output port 174), a second digital-to-analog converter (e.g., the digital-to-analog converter 120) to transmit a second pulse of electrical energy via a second output port (e.g., the output port 176), and a third digital-to-analog converter (e.g., the digital-to-analog converter 122) to transmit a third pulse of electrical energy via a third output port (e.g., the output port 178).

Figure 3:
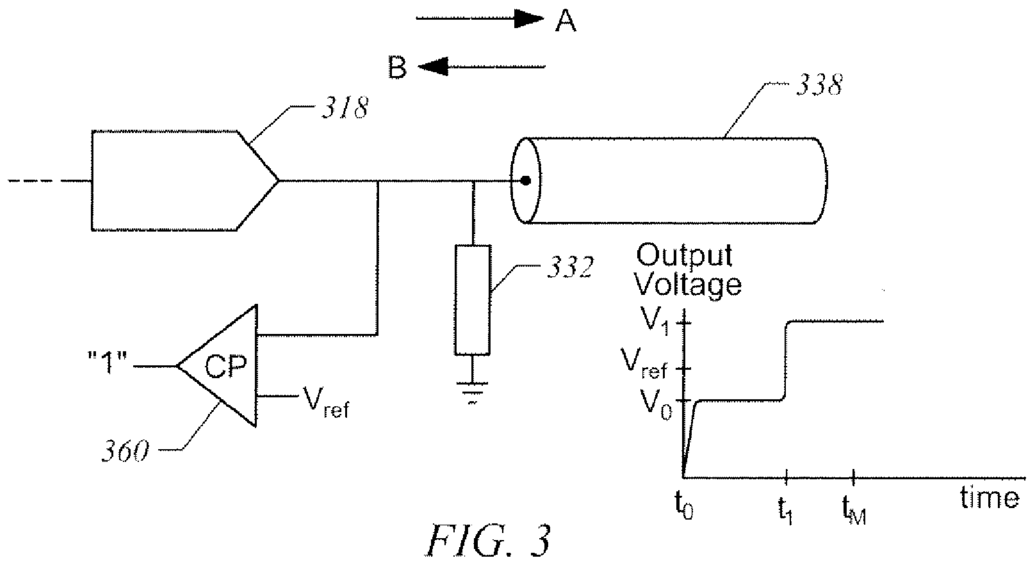
FIG. 3 and FIG. 4 illustrate certain hardware components and certain outputs when operating these hardware components in accordance with an embodiment of the invention.
Figure 4:
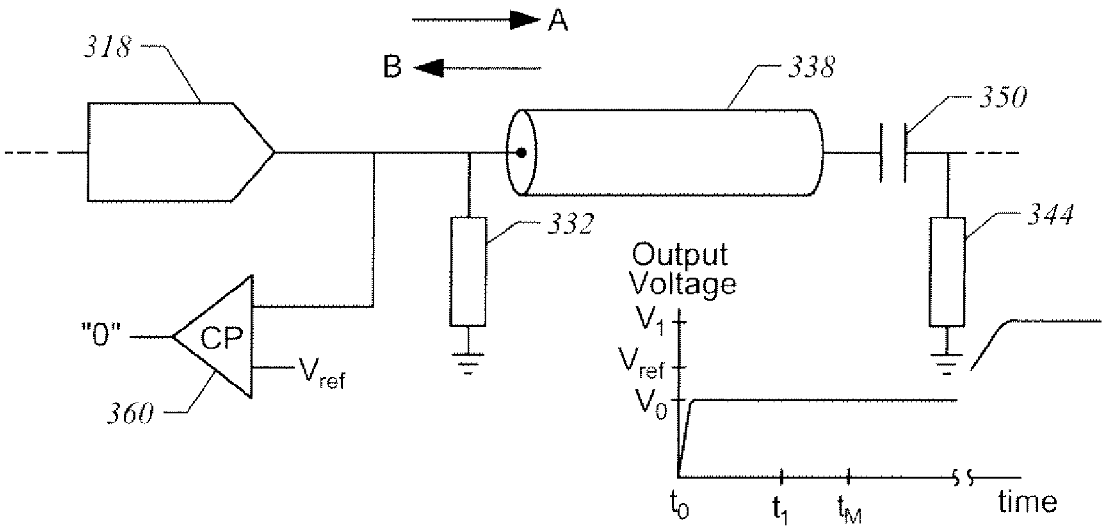

FIG. 3 and FIG. 4 illustrate certain hardware components and certain outputs when operating these hardware components in accordance with an embodiment of the invention. As illustrated in FIG. 3 and FIG. 4, an output end of a digital-to-analog converter 318 is connected to a CP 360. The output end of the digital-to-analog converter 318 is also connected to an internal electrical load, namely a resistor 332, which is connected to a first end of a cable 338. FIG. 3 illustrates a scenario in which a second end of the cable 338 is not connected to any external electrical load, while FIG. 4 illustrates a scenario in which the second end of the cable 338 is connected to an external electrical load, namely a resistor 344, via a coupling capacitor 350. The resistor 344 and the coupling capacitor 350 can be included in an output device such as a television set. The plots included in FIG. 3 and FIG. 4 illustrate an output voltage of the digital-to-analog converter 318 as a function of time. During operation, the digital-to-analog converter 318 receives a digital signal via its input end, and, in response to receiving this digital signal, the digital-to-analog converter 318 transmits, via its output end, a pulse of electric current starting at time to. In the illustrated embodiment, the pulse of electric current is a square pulse having a certain magnitude and a certain pulse duration. An incident portion of the pulse of electric current passes through the cable 338 along the direction of arrow A, while another incident portion of the pulse of electric current passes through the resistor 332, thus causing the output voltage of the digital-to-analog converter 318 to rise around time to until a certain magnitude $V_o$ is reached. As can be appreciated, the magnitude $V_o$ depends on the magnitude of the pulse of electric current.

The second operation illustrated in FIG. 2 is to determine that at least one of the set of output ports is connected to an output device (e.g., the output device 104) based on a degree of reflection of the set of pulses of electrical energy (block 202). In the illustrated embodiment, a load detection module (e.g., the load detection module 156) is connected to the set of digital-to-analog converters, and the load detection module determines whether each of the set of digital-to-analog converters is connected to the output device based on a degree to which a pulse of electrical energy that is transmitted by that digital-to-analog converter is reflected. For example, the load detection module can determine that the first digital-to-analog converter is connected to the output device if the first pulse of electrical energy transmitted via the first output port is reflected to a relatively small degree, such as below a certain reference level. In a similar manner, the load detection module can determine that the second digital-to-analog converter is connected to the output device if the second pulse of electrical energy transmitted via the second output port is reflected to a relatively small degree, such as below that reference level. On the other hand, the load detection module can determine that the third digital-to-analog converter is disconnected from the output device if the third pulse of electrical energy transmitted via the third output port is reflected to a relatively large degree, such as above that reference level.

Referring back to FIG. 3 and FIG. 4, once the digital-to-analog converter 318 transmits the pulse of electric current, the CP 360 determines a degree to which the pulse of electric current is reflected based on the output voltage of the digital-to-analog converter 318. To accurately determine a connection status of the digital-to-analog converter 318 in the possible presence of the coupling capacitor 350, the output voltage of the digital-to-analog converter 318 is detected at a measurement time $t_M$ during a transient response time period. As discussed previously, the transient response time period can be an initial time period during which the coupling capacitor 350 substantially behaves as a "short-circuit". In the illustrated embodiment, the transient response time period is an initial time period subsequent to the start of transmission of the pulse of electric current at time to and prior to the coupling capacitor 350, if connected to the digital-to-analog converter 318, being substantially charged up by the pulse of electric current. For certain implementations, the coupling capacitor 350 can be deemed to be substantially charged up after a passage of time equal to a charging time constant associated with the coupling capacitor 350, at which point the coupling capacitor 350 is charged up to about 63 percent of full capacity.

With reference to FIG. 3, the incident portion of the pulse of electric current that passes through the cable 338 reaches the second end of the cable 338 and is reflected back towards the first end of the cable 338 along the direction of arrow B. Eventually, this reflected portion of the pulse of electric current reaches the first end of the cable 338 and then passes through the resistor 332 along with another incident portion of the pulse of electric current, thus causing the output voltage of the digital-to-analog converter 318 to rise around time $t_1$ until a certain magnitude $V_1$ is reached. As can be appreciated, the magnitude $V_1$ is about twice the magnitude $V_o$. Time $t_1$ depends on a length L of the cable 338 and a signal propagation speed c of the cable 338 according to the relationship: $t_1=t_0+2$ L/c. For example, if the cable 338 has a length L of 10 m and a signal propagation speed of 0.2 m/ns, time $t_1$ is 100 ns after time to. In the illustrated embodiment, time $t_1$ can be viewed as a minimum waiting time prior to detecting the output voltage of the digital-to-analog converter 318, such that the measurement time $t_M$ is equal to or after time $t_1$. During operation, the CP 360 receives the output voltage of the digital-to-analog converter 318 at the measurement time $t_M$ and compares the output voltage with a reference voltage $V_{ref}$. Since the reference voltage $V_{ref}$ is exceeded as illustrated in FIG. 3, the CP 360 generates an indication that the digital-to-analog converter 318 is not connected to the resistor 344, namely a binary "1".

With reference to FIG. 4, the incident portion of the pulse of electric current that passes through the cable 338 reaches the second end of the cable 338 and then passes through the resistor 344 via the coupling capacitor 350, which substantially behaves as a "short-circuit" during the transient response time period. As a result, the output voltage of the digital-to-analog converter 318 substantially remains at the magnitude $V_o$ during the transient response time period. During operation, the CP 360 receives the output voltage of the digital-to-analog converter 318 at the measurement time $t_M$ and compares the output voltage with the reference voltage $V_{ref}$. Since the reference voltage $V_{ref}$ is not exceeded as illustrated in FIG. 4, the CP 360 generates an indication that the digital-to-analog converter 318 is connected to the resistor 344, namely a binary "0". As illustrated in FIG. 4, the coupling capacitor 350 eventually charges up and behaves as an "open circuit", thus causing the output voltage of the digital-to-analog converter 318 to rise to the magnitude $V_1$.

The third operation illustrated in FIG. 2 is to transmit at least one of an audio signal and a video signal to the output device via the at least one of the set of output ports (block 204). In the illustrated embodiment, a control module (e.g., the control module 180) is connected to and directs operation of the set of digital-to-analog converters, the pulse generation module, and the load detection module. Based on which ones of the set of digital-to-analog converters (if any) are connected to the output device, the control module directs those digital-to-analog converters to transmit either of, or both, the audio signal and the video signal to the output device. Also, based on how many of the set of digital-to-analog converters are connected to the output device, the control module selects a format of either of, or both, the audio signal and the video signal that is transmitted to the output device. For example, the output device can be a television set, and, depending on whether a single digital-to-analog converter, two digital-to-analog converters, or three digital-to-analog converters are connected to the television set, the control module can select a composite video format, a S-video format, or a component video format, respectively. In the event that the first digital-to-analog converter and the second digital-to-analog converter are connected to the television set, the control module can direct the first digital-to-analog converter to transmit a first component of a television signal via the first output port and the second digital-to-analog converter to transmit a second component of the television signal via the second output port. Advantageously, the illustrated embodiment provides a mechanism to automatically determine a connection status of the set of output ports with respect to the output device. Based on this connection status, the illustrated embodiment provides a mechanism to automatically select an audio/video format that is appropriate for the output device.

Figure 5:
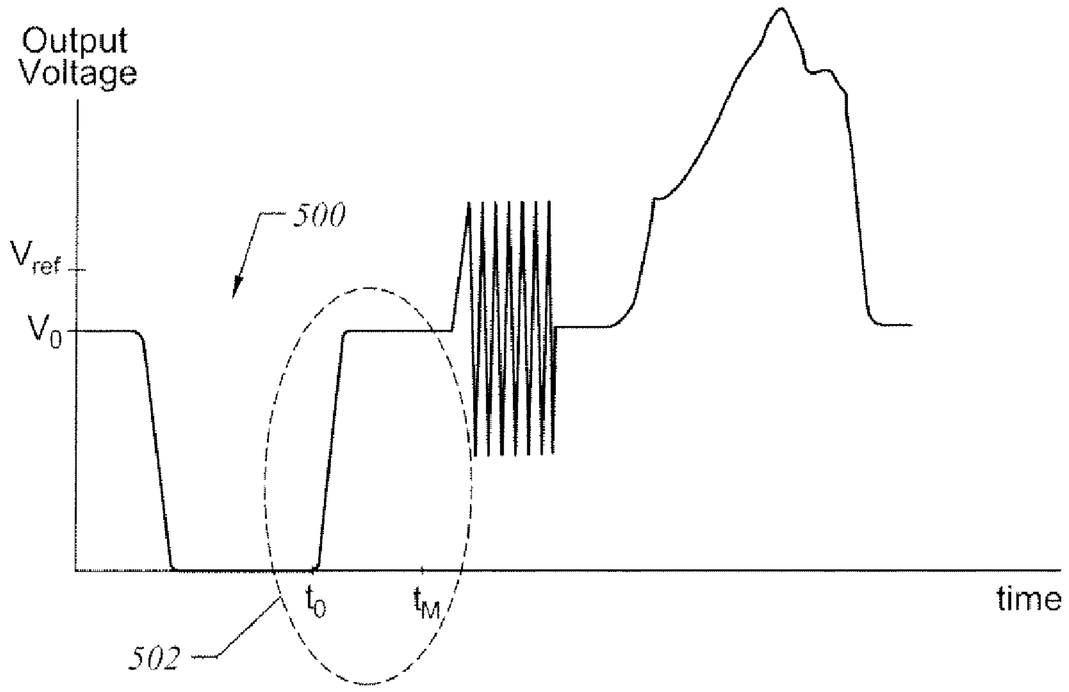
FIG. 5 illustrates an example of a television signal including a synchronization interval.

It should be recognized that the embodiments of the invention discussed above are provided by way of example, and various other embodiments are encompassed by the invention. For example, it is contemplated that an audio signal or a video signal itself can be used to detect an external electrical load of a digital-to-analog converter, according to some embodiments of the invention. Referring to FIG. 5, an example of a television signal that can be transmitted by a digital-to-analog converter is illustrated. In particular, the plot included in FIG. 5 illustrates an output voltage of the digital-to-analog converter as a function of time as the digital-to-analog converter transmits the television signal. In the illustrated example, the television signal is a composite video signal that includes a built-in synchronization interval 500. The synchronization interval 500 includes a rising edge portion 502, during which the output voltage of the digital-to-analog converter rises around time to until a certain magnitude $V_o$ is reached. As can be appreciated by comparing the plot included in FIG. 5 with the plots included in FIG. 3 and FIG. 4, the rising edge portion 502 can effectively serve as a pulse of electrical energy that can be used to detect an external electrical load of the digital-to-analog converter. In particular, in a similar manner as previously discussed in connection with FIG. 3 and FIG. 4, the output voltage of the digital-to-analog converter can be detected at a measurement time $t_M$ during a transient response time period. If a certain reference voltage $V_f$ is exceeded, the external electrical load is deemed to be not present. On the other hand, if the reference voltage $V_{ref}$ is not exceeded, the external electrical load is deemed to be connected to the digital-to-analog converter. In such manner, a connection status of the digital-to-analog converter with respect to the external electrical load can be monitored as the digital-to-analog converter transmits the television signal.

With reference to FIG. 1, while the pulse generator 158 is illustrated as a unitary component, it is contemplated that the pulse generator 158 can be implemented using multiple components in accordance with some embodiments of the invention. In particular, each of these multiple components can be connected to a respective one of the digital-to-analog converters 118, 120, and 122 and can direct that digital-to-analog converter to transmit a pulse of electrical energy. It is also contemplated that the pulse generator 158 can transmit pulses of electrical energy via the output ports 174, 176, and 178 without using the digital-to-analog converters 118, 120, and 122. Also, while not illustrated in FIG. 1, it is contemplated that a buffering module can be connected between the memory controller 114 and the output engine 112 in accordance with some embodiments of the invention. The buffering module can operate to cover for or reduce memory access latency by storing an advance supply of data to be processed by the output engine 112.

Also, with reference to FIG. 1, various components of the computer system 100 can be implemented in a number of ways, such as using hardwired circuitry, computer code, or a combination of hardwired circuitry and computer code. For example, the pulse generator 158 can be implemented using hardwired circuitry in the form of, for example, Application-Specific Integrated Circuits ("ASICs") or Programmable Logic Devices ("PLDs"). As another example, the control module 180 can be implemented using computer code in place of, or in combination with, hardwired circuitry. Examples of computer code include machine code, such as produced by a compiler, and files containing higher-level code that are executed using an interpreter. Additional examples of computer code include encrypted code and compressed code.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process operation or operations, to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A processing apparatus to direct operation of a set of digital-to-analog converters, comprising:

a load detection module connected to said set of digital-to-analog converters said load detection module being configured to detect an output voltage of each of said set of digital-to-analog converters to determine whether said each of said set of digital-to-analog converters is connected to an output device via a coupling capacitor, said output voltage being detected subsequent to a start of transmission of a pulse of electrical energy by said each of said set of digital-to-analog converters and prior to said coupling capacitor being substantially charged up by said pulse of electrical energy; and a control module connected to said set of digital-to-analog converters and to said load detection module, said control module being configured to direct transmission of a signal to said output device via at least one of said set of digital-to-analog converters that is connected to said output device, said control module being configured to select a format of said signal based on how many of said set of digital-to-analog converters are connected to said output device.

2. The processing apparatus of claim 1, wherein said coupling capacitor has a charging time constant, said load detection module is configured to detect said output voltage at a measurement time, and said measurement time is defined with respect to said start of transmission of said pulse of electrical energy and is smaller than said charging time constant of said coupling capacitor.

3. The processing apparatus of claim 1, wherein said load detection module is configured to compare said output voltage with a reference voltage to determine whether said each of said set of digital-to-analog converters is connected to said output device.

4. The processing apparatus of claim 1 wherein said output device corresponds to a television set, said load detection module is configured to determine that a subset of said set of digital-to-analog converters is connected to said television set, and said control module is configured to direct said subset of said set of digital-to-analog converters to transmit a television signal to said television set.

5. The processing apparatus of claim 4, wherein said control module is configured to select a format of said television signal based on said subset of said set of digital-to-analog converters, and said format of said television signal corresponds to one of composite video format, S-video format, and component video format.

6. The processing apparatus of claim 4, wherein said control module is configured to direct a first digital-to-analog converter to transmit a first component of said television signal to said television set if said first digital-to-analog converter is connected to said television set, and said control module is configured to direct a second digital-to-analog converter to transmit a second component of said television signal to said television set if said second digital-to-analog converter is connected to said television set.

7. The processing apparatus of claim 1, further comprising:

a pulse generation module connected to said set of digital-to-analog converters, said pulse generation module being configured to direct said each of said set of digital-to-analog converters to transmit said pulse of electrical energy.

* * * * *